United States Patent [19]

Kalb et al.

[11] 3,769,530

[45] Oct. 30, 1973

[54] MULTIPLE EMITTER TRANSISTOR APPARATUS

[75] Inventors: Jeffrey C. Kalb, San Jose; Robert J. Widlar, Mountain View, both of Calif.

[73] Assignee: National Semiconductor Corp., Santa Clara, Calif.

[22] Filed: Feb. 24, 1971

[21] Appl. No.: 118,441

Related U.S. Application Data

[62] Division of Ser. No. 840,987, July 11, 1969, Pat. No. 3,702,955.

[52] U.S. Cl. ............... 307/299 A, 307/215, 307/313

[51] Int. Cl. ............................................. H03k 3/26

[58] Field of Search ................ 307/203, 215, 299 A, 307/313

[56] References Cited

UNITED STATES PATENTS

| | | | |
|---|---|---|---|
| 3,229,119 | 1/1966 | Bohn et al. | 307/299 A |
| 3,233,125 | 2/1966 | Buie | 307/215 |
| 3,283,170 | 11/1966 | Buie | 307/299 A |
| 3,394,268 | 7/1968 | Murphy | 307/299 A |
| 3,452,216 | 6/1969 | Hirsch | 307/299 A |

*Primary Examiner*—Stanley D. Miller, Jr.
*Attorney*—Harvey G. Lowhurst

[57] ABSTRACT

A non-gold doped multiple emitter transistor device having an additional lateral PNP transistor formed in the collector region and a debiasing resistance formed in the base region, these elements cooperating to suppress the inherent PNP beta to substrate characteristic and control the inverse $H_{fe}$ of the device. The emitter of the additional transistor is connected to the base of the MET through a pinch-type debiasing resistor formed in a projection of the base region of the MET, and the base and collector of the additional transistor are shorted together and connected to the collector of the MET so as to provide a shunt path around the base-collector junction thereof.

9 Claims, 4 Drawing Figures

PATENTED OCT 30 1973 3,769,530

INVENTORS
JEFFREY C. KALB
ROBERT J. WIDLAR

Lowhurst & Hamrick
ATTORNEY

MULTIPLE EMITTER TRANSISTOR APPARATUS

This application is a division of my copending application Ser. No. 840,987, filed July 11, 1969, now U.S. Pat. No. 3,702,955.

BACKGROUND OF THE INVENTION

The present invention relates generally to multiple emitter transistors and, more particularly, to a novel method of construction of a multiple emitter transistor for use in TTL circuits.

In multiple emitter transistors (MET's), such as are described in the U.S. Pat. to Buie No. 3,283,170 , the collector is direct coupled into the base of a controlled transistor so that when none of the emitters of the MET are selectively pulled lower than the collector potential, current is allowed to flow through the base-collector junction of the MET and into the base of the controlled transistor so as to maintain it in the conductive state. This current flow is that which produces a phenomenon known in the art as the inverse $H_{fe}$ of the MET device. In addition, because of the nature of the construction of the MET, an inherent PNP leakage path is also created between the base of the MET and the substrate in which it is formed so as to effectively shunt to ground a large portion of the current intended to provide the base drive for the controlled transistor before it is able to reach the controlled transistor. This structural characteristic gives rise to the phenomenon referred to in the art as PNP beta to substrate. This feature is generally considered undesirable and must be substantially reduced, in effect, where the MET is to be utilized in a TTL circuit, or the like, designed to handle high voltages.

Heretofore, gold doping has been utilized as a means for suppressing the current flow through the collector region (of the MET) and by positioning the collector terminal close to the base region effective discrimination against the PNP beta has been achieved. In addition to the gold doping, a debiasing resistance in the base circuit of the MET and a diode shunting this resistance and the base-collector junction are normally utilized to control the inverse $H_{fe}$. However, since gold doping reduces the life time of the injected carriers in the collector region and thus tends to reduce the beta of the device, it is highly desirable that a MET structure be provided which does not require that gold doping be utilized.

OBJECTS OF THE INVENTION

It is therefore a principal object of the present invention to provide a non-gold doped multiple emitter transistor for use in TTL circuits and the like, which has low inverse $H_{fe}$ as well as low PNP beta to substrate.

Another object of the present invention is to provide a novel non-gold doped multiple emitter transistor circuit which is better suited for utilization in TTL devices designed for high voltage applications.

Still another object of the present invention is to provide a novel non-gold doped multiple emitter transistor structure for high voltage applications utilizing additional integrated circuit elements as the means for providing against the PNP beta to substrate and inverse $H_{fe}$ problems inherently associated with structures of this type.

Still another object of the present invention is to provide a novel non-gold doped multiple emitter transistor device having an integrally formed debiasing resistance and an additional current shunting transistor element for providing a substantial reduction in the inherent beta to substrate while simultaneously providin adequate control of the inverse $H_{fe}$.

SUMMARY OF THE PRESENT INVENTION

In accordance with the present invention, an integrated circuit multiple emitter transistor device is provided having an additional lateral PNP transistor formed in the collector region and a debiasing resistance formed in the base region, these elements cooperating so as to suppress the inherent PNP beta to substrate characteristic and control the inverse $H_{fe}$ of the device. The emitter of the additional transistor is connected to the base of the MET through a debiasing resistor formed in a projection of the base region of the MET and the base and collector of the additional transistor are shorted together and connected to the collector of the MET so as to provide a shunt path around the base-collector junction thereof.

An important advantage of this novel structure is that gold doping need not be used to control the high inverse $H_{fe}$ and PNP beta to substrate characteristics of similar prior art structures, since these characteristics are substantially reduced by additional integrated circuit elements formed integral with the MET device.

Other advantages of the present invention will become apparent to those skilled in the art after having read the following detailed description of a preferred embodiment which is illustrated in the several figures of the drawing.

IN THE DRAWING

DETAILED DESCRIPTION OF THE PRESENT INVENTION

Figure 1:
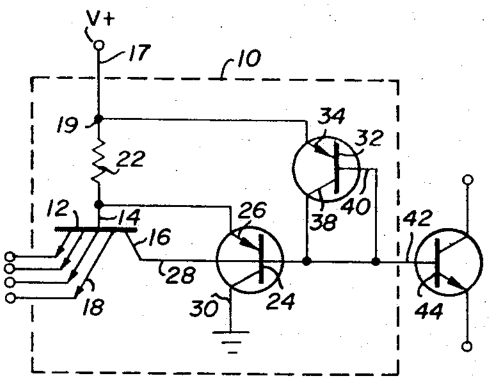
FIG. 1 is a schematic diagram of a multiple emitter transistor structure in accordance with the present invention.

Referring now to FIG. 1 of the drawing, there is shown at 10 a schematic diagram of a multiple emitter transistor (MET) circuit in accordance with the present invention. The circuit includes a multiple emitter NPN transistor 12 having a base 14, a collector 16 and a plurality of emitters 18. A terminal 19 is provided to which a suitable biasing source may be supplied. The base of the MET 12 is connected to terminal 17 through a debiasing resistance 22 which is formed in a portion of the base in a manner which will be described below. Because of the necessity of providing isolation for the transistor structure in the form of an isolation ring of P+ impurity, an inherent PNP element 24 is inadvertently created integral with the MET 12. This element 24 has its emitter 26 in common with the base 14 of the MET 12, its base 28 in common with the collector 16 of the MET 12, and its collector 30 coupled to the circuit ground. The actual physical interrelationship of these circuit elements will be explained below.

In addition to the MET 12 and the inherent PNP structure 24, an additional PNP structure 32 is intentionally included in the circuit having its emitter 34 coupled into the base circuit of the MET 12 at point 19 and its collector 38 and base 40 jointly connected to the collector 16 of the MET 12. The collector 16 of the MET device 10 is shown directly connected to the base 42 of an external transistor 44 to provide the base drive therefor.

In operation, the external transistor 44 is turned on by the application of the voltage $V^+$ to terminal 19 so long as none of the emitters 18 of the MET 12 are pulled low. Upon the initial application of the voltage $V^+$, current is caused to flow through the resistance 22 into the base 14 of the MET 12, out of the collector 16 thereof and thence into the base of the controlled transistor 44 causing it to become conductive. Under these conditions, the PNP element 24 also attempts to become conductive so as to provide a shunt path to ground for the current flowing into the MET 12. However, transistor 32 also becomes conductive to provide a shunt path around the resistance 22 and the MET 12 to the base 42 of transistor 44. Additionally, the placement of collector 38 of the PNP transistor 32 also reduces the PNP beta of PNP transistor 24 because of the field shaping which occurs in the base region of transistor 24.

The small amount of current which continues to flow through the resistance 22 produces a voltage drop thereacross which debiases the parasitic transistor 24 into its non-conductive state so that the leakage path to ground provided thereby is substantially eliminated. Thus, the PNP beta to ground problem which has heretofore perplexed the prior art is effectively controlled. In addition, since the current allowed to flow through the resistance 22 is maintained very low due to the substantial shunt produced thereacross by the transistor 32, the inverse $H_{fe}$ problem of the prior art is also effectively controlled.

By pulling any of the emitters 18 of the MET 12 to a lower potential than the collector 16, the MET 12 will become conductive and create a current path from collector 16 to the selected emitter 18 so as to rapidly drain the charge from the base 42 of the controlled transistor 44. This, of course, causes transistor 44 to be quickly turned OFF.

It will be noted that immediately following the selection of emitter 18, a current path will be provided from $V^+$ through transistor 32, which is still in its conductive state, and thence through the collector-emitter path of MET 12. This low impedance path permits an initial rush of current which rapidly drains the charge from the base 42 of transistor 44 so as to provide a quick turn off characteristic. It will also be noted that while the inverse $H_{fe}$ of MET 13 is controlled by the current flow characteristics produced by the combination of resistor 22 and transistor 32, these two elements also cooperate to maintain the PNP element 24 in a debiased state so that the beta to substrate problem is also controlled.

Figures 2, 3:
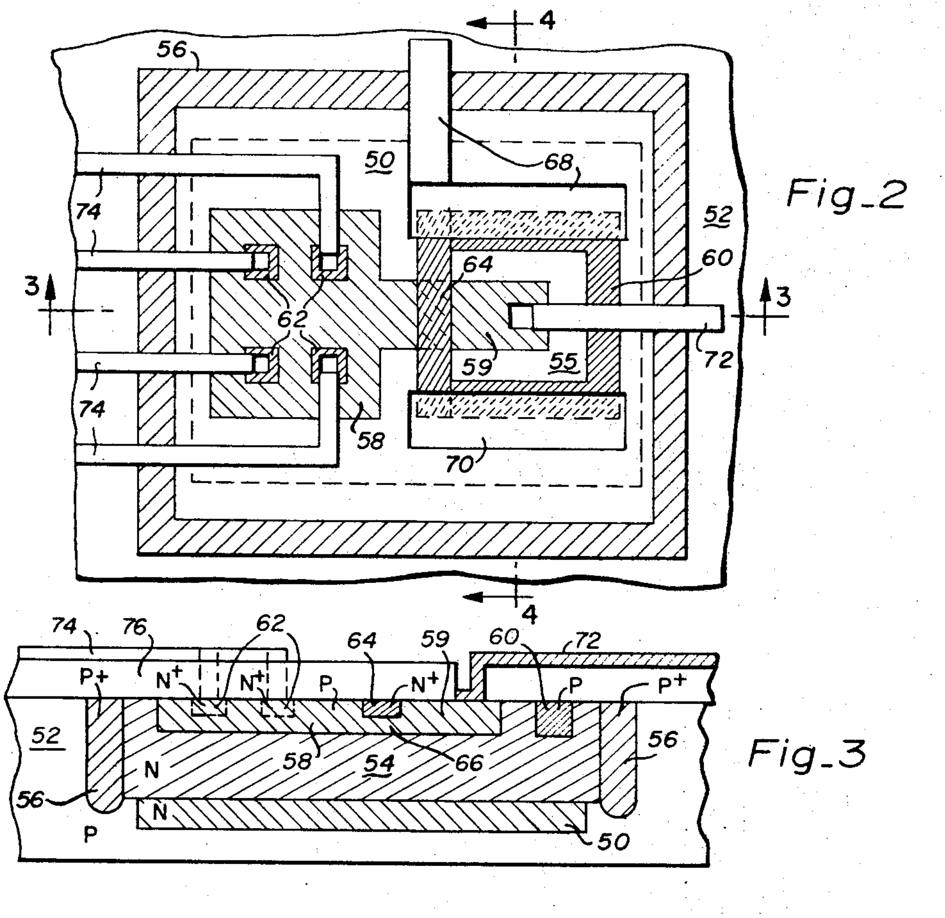
FIG. 2 is a plan view illustrating a preferred form of an MET constructed in accordance with the present invention.
FIG. 3 is a cross section of the MET illustrated in FIG. 2 taken along the lines 3—3.

Turning now to FIG. 2 of the drawing, an exemplary embodiment of the device schematically depicted in FIG. 1 is illustrated. The substrate material is initially prepared using the buried layer epitaxial process well-known in the prior art wherein a buried layer 50 of n-type impurity is provided in the p-type substrate 52 (see also FIG. 3). An n film collector region 54 is epitaxially deposited and the surrounding $p^+$ isolation region 56 is then diffused thereinto surrounding the buried layer 50. The keyhole shaped p-type base region 58 and the U-shaped p-type region 60 are then diffused into the n-type region 54 as illustrated. The $n^+$ type regions 62 are then diffused into the p-type region 58 and the same diffusion is made into the elongated region 64 adjacent the ends of the p-type region 60 and across a portion of the p-type region 58.

It can now be seen that the base 14, collector 16 and emitter 18 of the MET 12 shown in FIG. 1 are respectively provided by the p-type region 58, the n-flm 50 and the n-type regions 62; the base 28 collector 30 and emitter 26 of the parasitic PNP element 24 are respectively formed by the $n^+$ region 54, the p-type region 56 and the p-type isolation ring 58; and the debiasing resistor 22 is formed by the diffusion of the $n^+$ region 64 across the upper portion of the p-type region 58. This $n^+$ region effectively reduces the cross section of the p-type region 58 therebeneath so as to form a pinch resistor at 66 FIG. 3.

The resistance 22 results because the base current entering portion 59 of base region 58 is forced to flow through the substantially smaller cross section 66 of the lightly doped base region in order to reach the emitter diffused portion of region 58. The shunting transistor 32 illustrated in FIG. 1 and having emitter 34, collector 38 and base 40 is formed by the portion 59 of base region 58, the P-type region 60 and the portion 55 of collector region 54, respectively.

Figure 4:
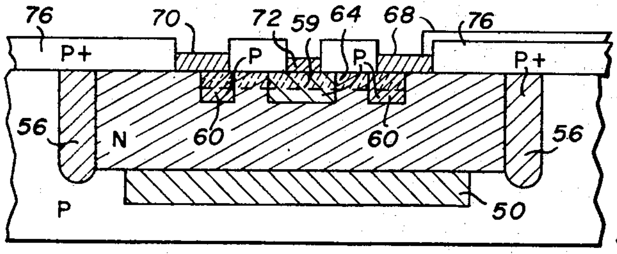
FIG. 4 is a cross-section of the MET illustrated in FIG. 2 taken along the lines 4—4.

In order to provide the desired interconnection of the various transistor elements, metallic contacts 68 and 70 are positioned as shown and caused to ohmically contact the regions 60 and 64 shorting them together as partially illustrated in FIG. 4. Interconnect means 72 and 74 are also provided for contacting the base region 59 and the emitter regions 62. The ohmic contacts between the respective semiconductive regions and the interconnects are, of course, formed at apertures provided in the overlying oxide layer 76.

In accordance with the illustrated preferred embodiment of the invention, a non-gold doped MET may be provided having a controlled PNP beta to substrate of approximately 0.01 and an inverse $H_{fe}$ of about 0.001 to 0.003. Although the MET of the present invention is shown to be of the NPN type, it is to be understood that a similar technique could be used to provide a non-gold doped PNP MET.

After having read the above disclosure, it is contemplated that many alterations and modifications of the invention will become apparent to those of skill in the art. It is therefore to be understood that this description is of a preferred embodiment set forth for purposes of illustration only and is in no manner intended to be of a limiting nature. Accordingly, it is intended that the appended claims be interpreted as covering all modifications which fall within the true spirit and scope of the invention.

What is claimed is:

1. A multiple emitter transistor circuit comprising a first terminal, an output terminal and a plurality of input terminals;

a multiple emitter transistor means having its base coupled through a debiasing resistance to said first terminal, its collector coupled to said output terminal and its emitters coupled to said input terminals;

a second transistor means of a conductivity type opposite that of said multiple emitter transistor having its emitter coupled to said first terminal and its base and collector coupled to said output terminal, said second transistor means providing a shunting current path from said first terminal to said output terminal around said resistance and the base-collector junction of said multiple emitter transistor means.

2. A multiple emitter transistor circuit as recited in claim 1 wherein said multiple emitter transistor means, said second transistor means and said resistance means are formed in a single integrated circuit.

3. A multiple emitter transistor circuit as recited in claim 2 wherein an isolation region of the same conductivity type as the base of said multiple emitter transistor is formed around said multiple emitter transistor means, said resistance and said second transistor means such that the base and collector regions of said multiple emitter transistor and the isolation region form a bipolar leakage path beween the base of said multiple emitter transistor means and the substrate material in which it is formed.

4. A transistor circuit, comprising:

a first voltage source terminal;

an output terminal;

an input terminal;

a resistive impedance;

a first transistor of a first conductivity type having a first base coupled to said first terminal through said resistive impedance, a first collector coupled to said output terminal, and a first emitter coupled to said input terminal, said resistive impedance and base-collector junction of said first transistor forming a first current path between said first terminal and said output terminal; and a second transistor of a second conductivity type having a second emitter coupled to said first terminal, a second base coupled to said output terminal, and a second collector coupled to said output terminal, the base-emitter junction of said second transistor forming a second current path between said first terminal and said output terminal in shunt with said first current path.

5. A transistor circuit as recited in claim 4 and further comprising, a second voltage source terminal, and a third transistor of said second conductivity type having a third emitter coupled to said first base, a third base coupled to said first collector, and a third collector coupled to said second terminal.

6. A transistor circuit, comprising:

a first terminal for connection to a first source of potential;

a second terminal for connection to a second source of potential;

a plurality of input terminals;

an output terminal;

a first transistor of a first conductivity type having a plurality of emitters respectively coupled to said input terminals, a first base, and a first collector coupled to said output terminal;

a resistor coupling said first base to said first terminal;

a second transistor of a second conducitvity type having a second emitter coupled to said first base, a second base coupled to said first collector and said output terminal, and a second collector coupled to said second terminal; and means forming a low impedance path between said first terminal and said output terminal to increase the turn on time of said first transistor.

7. A transistor circuit comprising:

a first terminal for connection to a first source of potential;

a second terminal for connection to a second source of potential;

a plurality of input terminals;

an output terminal;

a first transistor of a first conductivity type having a plurality of emitters respectively coupled to said input terminals, a first base, and a first collector coupled to said output terminal;

a resistor coupling said first base to said first terminal;

a second transistor of a second conductivity type having a second emitter coupled to said first base, a second base coupled to said first collector and said output terminal, and a second collector coupled to said second terminal; and means forming a low impedance path between said first terminal and said output terminal to increase the turn on time of said first transistor.

8. A transistor circuit comprising:

a first terminal for connection to a first source of potential;

a second terminal for connection to a second source of potential;

a plurality of input terminals;

an output terminal;

a first transistor of a first conductivity type having a plurality of emitters respectively coupled to said input terminals, a first base, and a first collector coupled to said output terminal;

a resistor coupling said first base to said first terminal; and a second transistor of a second conductivity type having a second emitter coupled to said first base, a second base coupled to said first collector and said output terminal, and a second collector coupled to said second terminal.

9. A transistor circuit as recited in claim 8 and further comprising a third transistor of said second conductivity type having a third emitter coupled to said first terminal, a third base coupled to said output terminal, and a third collector coupled to said output terminal.

* * * * *